(12) United States Patent
Long (10) Patent No.: US 11,211,260 B2
(45) Date of Patent: Dec. 28, 2021

(54) SEMICONDUCTOR STRUCTURE AND METHOD FOR FORMING SAME

(71) Applicants: Semiconductor Manufacturing International (Shanghai) Corporation, Shanghai (CN); Semiconductor Manufacturing International (Beijing) Corporation, Beijing (CN)

(72) Inventor: Zhang Cheng Long, Shanghai (CN)

(73) Assignees: Semiconductor Manufacturing (Shanghai) International Corporation, Shanghai (CN); Semiconductor Manufacturing (Beijing) International Corporation, Beijing (CN)

( * ) Notice: Subject to any disclaimer, the term of this patent is extended or adjusted under 35 U.S.C. 154(b) by 0 days.

(21) Appl. No.: 16/861,784

(22) Filed: Apr. 29, 2020

(65) Prior Publication Data
US 2021/0050225 A1    Feb. 18, 2021

(30) Foreign Application Priority Data
Aug. 14, 2019    (CN) .......................... 201910749782.1

(51) Int. Cl.
| | | |
|---|---|---|
| H01L 21/00 | (2006.01) | |
| H01L 21/467 | (2006.01) | |
| H01L 29/66 | (2006.01) | |
| H01L 21/8234 | (2006.01) | |

(52) U.S. Cl.
CPC .... *H01L 21/467* (2013.01); *H01L 21/823437* (2013.01); *H01L 21/823481* (2013.01); *H01L 29/66545* (2013.01); *H01L 29/66583* (2013.01)

(58) Field of Classification Search
None
See application file for complete search history.

(56) References Cited

U.S. PATENT DOCUMENTS

| | | | |
|---|---|---|---|
| 2019/0006345 A1* | 1/2019 | Wang | ................. H01L 27/0207 |
| 2019/0386002 A1* | 12/2019 | Wu | .................... H01L 29/0649 |

\* cited by examiner

*Primary Examiner* — Reema Patel
(74) *Attorney, Agent, or Firm* — Crowell & Moring LLP (57) ABSTRACT

A semiconductor structure and a method for forming same are provided, the forming method including: providing a base including a plurality of adjacent device unit regions, an initial device gate structure spanning a plurality of device unit regions being formed on the base; etching a portion of the initial device gate structure in thickness at a junction between the adjacent device unit regions to form a top opening; forming a spacer layer on a side wall of the top opening; etching a remainder of the initial device gate structure exposed from the spacer layer, and forming a bottom opening exposed from the base within the remainder of the initial device gate structure, the remainder of the initial device gate structure being used as a device gate structure; and forming an isolation structure within the top opening and the bottom opening. The spacer layer is configured to adjust a width of the bottom opening, so that the width of the bottom opening is less than a width of the top opening. Therefore, the width of the top opening can be increased properly to enlarge a process window in which the top opening is formed, thereby better implementing isolation between the adjacent device unit regions and improving integrity of the device gate structure, further helping improve performance of a transistor.

11 Claims, 7 Drawing Sheets

SEMICONDUCTOR STRUCTURE AND METHOD FOR FORMING SAME

RELATED APPLICATIONS

The present application claims priority to Chinese Patent Appln. No. 201910749782.1, filed Aug. 14, 2019, the entire disclosure of which is hereby incorporated by reference.

BACKGROUND

Technical Field

Embodiments and implementations of the present disclosure relate to the field of semiconductor manufacturing, and in particular, to a semiconductor structure and a method for forming same.

Related Art

A main semiconductor device of an integrated circuit, especially a super-large-scale integrated circuit, is a metal-oxide semiconductor field-effect transistor (an MOS transistor). With the continuous development of integrated circuit manufacturing technologies, a critical dimension of the MOS transistor has become increasingly small, and various secondary effects caused by physical limits of devices appear successively, causing difficulty of scaling down a critical dimension of the device. One of the most challenging problems is how to alleviate a large leakage current of a semiconductor device.

A solution that is currently proposed is forming a metal gate structure using a high-k metal gate (HKMG) technology, that is, forming a gate dielectric layer using a dielectric material (which is generally referred to as a high-k gate dielectric material) having a high dielectric constant, and forming a gate electrode using a conductive material (which is generally referred to as a metal material) including a metal element, so as to prevent a Fermi level pinning effect and a boron penetration effect from occurring on the high-k gate dielectric material and a conventional gate electrode material. The high-k metal gate is introduced, so that the leakage current of the semiconductor device is reduced.

SUMMARY

A solution to a problem to be resolved in embodiments and implementations of the present disclosure is providing a semiconductor structure and a method for forming same, so as to improve performance of the semiconductor structure.

To address the foregoing problem, one form of the present disclosure provides a method for forming the semiconductor structure, including: providing a base, where the base includes a plurality of adjacent device unit regions, an initial device gate structure is formed on the base, and the initial device gate structure spans the plurality of device unit regions; etching a portion of the initial device gate structure in thickness at a junction between the adjacent device unit regions to form a top opening within the initial device gate structure; forming a spacer layer on a side wall of the top opening; etching a remainder of the initial device gate structure exposed from the spacer layer, and forming a bottom opening exposed from the base within the initial device gate structure, where the bottom opening is in communication with the top opening, and the remainder of the initial device gate structure is used as a device gate structure; and forming an isolation structure within the top opening and the bottom opening.

Another form of the present disclosure provides a semiconductor structure, including: a base, where the base includes a plurality of adjacent device unit regions; a device gate structure located on the base, where adjacent device gate structures and the base enclose a T-shaped opening at a junction between the adjacent device unit regions, the opening including a bottom opening and a top opening, a top of the bottom opening being in communication with a bottom of the top opening, and along a direction perpendicular to a side wall of the opening, a width of the top opening is greater than a width of the bottom opening; a spacer layer located on a side wall of the top opening, a side wall of the spacer layer being flush with a side wall of the bottom opening; and an isolation structure located in the top opening exposed from the spacer layer and the bottom opening.

In comparison to the prior art, technical solutions of embodiments and implementations of the present disclosure have the following advantages.

In embodiments and implementations of the present disclosure, the portion of the initial device gate structure in thickness at the junction between where adjacent device unit regions are etched, and a top opening is formed within the initial device gate structure to form a spacer layer on a side wall of the top opening. Then, the remainder of the initial device gate structure exposed from the spacer layer is etched to form a bottom opening exposed from the base within the remainder of the initial device gate structure, where the remainder of the initial device gate structure is used as a device gate structure. The spacer layer is configured to adjust a width of the bottom opening, so that the width of the bottom opening is less than a width of the top opening. Therefore, in embodiments and implementations of the present disclosure, the width of the top opening can be properly increased, which helps enlarge a process window in which the top opening is formed, thereby better implementing isolation between adjacent device unit regions, and integrity of the device gate structure is improved, further helping to improve a performance of the semiconductor structure.

DETAILED DESCRIPTION

FIG. 1 to FIG. 5 are schematic structural diagrams showing corresponding steps in a method for forming a semiconductor structure.

Figure 1:
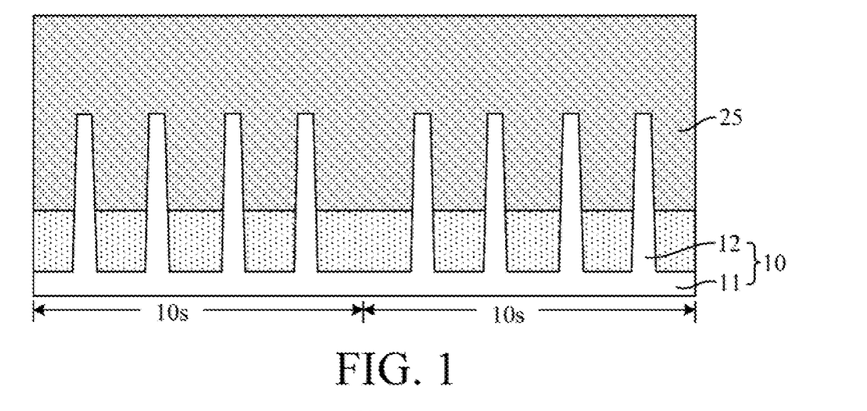
FIG. 1 to FIG. 5 are schematic structural diagrams showing corresponding steps in one form of a method for forming a semiconductor structure.

Referring to FIG. 1, a base 10 is provided, where the base 10 includes a plurality of adjacent device unit regions 10s, and the base 10 includes a substrate 11 and a fin 12 protruding from the substrate 11. An initial dummy gate structure 25 spanning the fin 12 is formed on the base 11, where the initial dummy gate structure 25 covers a portion of a top and a portion of a side wall of the fin 12.

Figure 2:
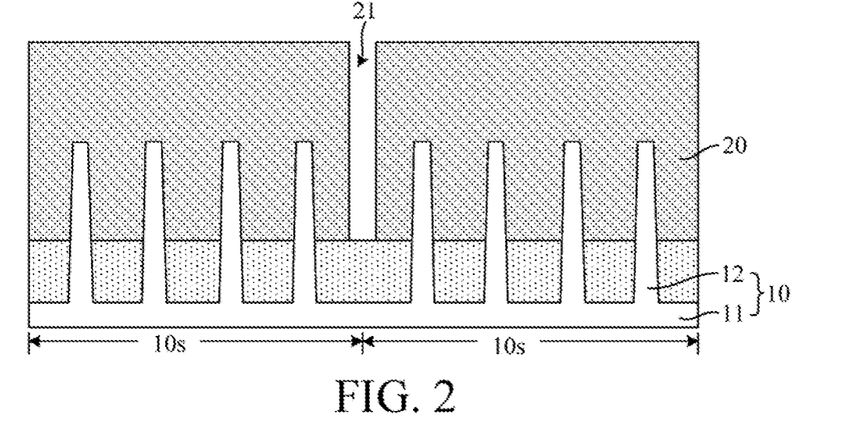

Referring to FIG. 2, the initial dummy gate structure 25 at a junction between the adjacent device unit regions 10s is removed to form an opening 21 exposed from the substrate 11 within the initial dummy gate structure 25, and a remainder of the initial dummy gate structure 25 is used as a dummy gate structure 20.

Figure 3:
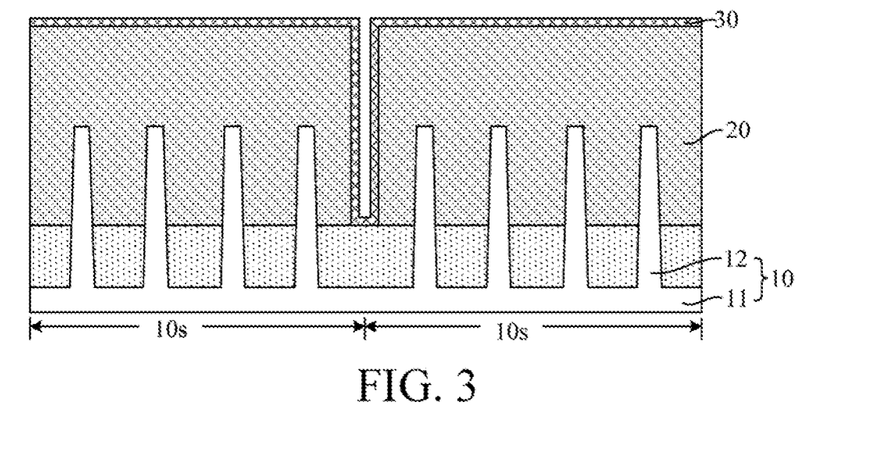

Referring to FIG. 3, a contact etch stop layer (CESL) 30 that conformally covers the dummy gate structure 20 and the substrate 11 is formed.

Correspondingly, the contact etch stop layer 30 conformally covers a bottom and a side wall of the opening 21.

Figure 4:
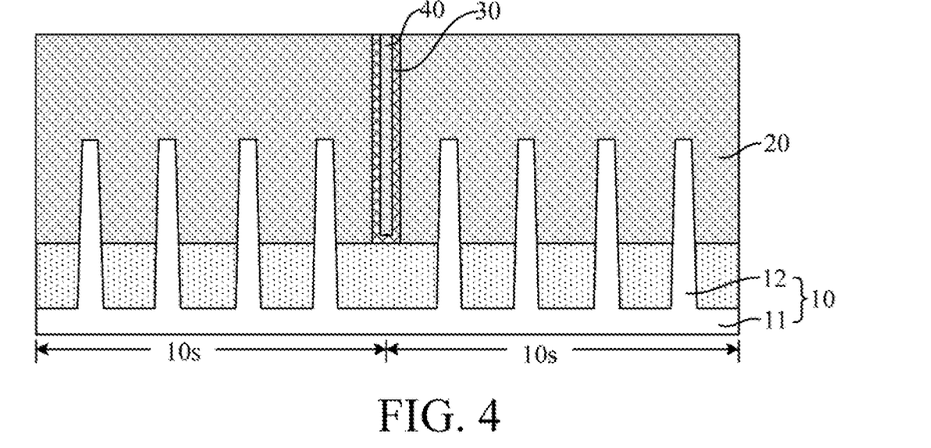

Referring to FIG. 4, an interlayer dielectric layer 40 is formed on the substrate 11 exposed from the dummy gate structure 20, the interlayer dielectric layer 40 being exposed from a top of the dummy gate structure 20.

Correspondingly, the interlayer dielectric layer 40 is further filled within a remainder of the opening 21 exposed from the contact etch stop layer 30.

Figure 5:
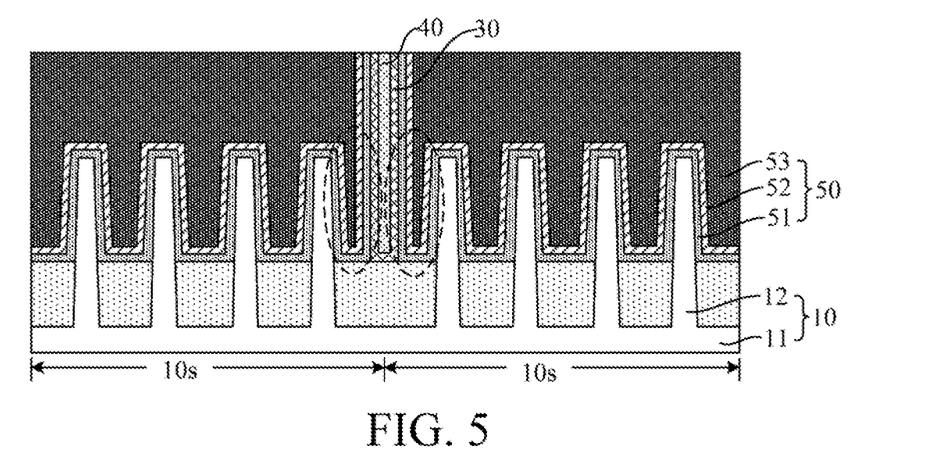

Referring to FIG. 5, the dummy gate structure 20 (as shown in FIG. 4) is removed, a gate opening (not shown) is formed within the interlayer dielectric layer 40, and a metal gate structure 50 is formed within the gate opening.

The metal gate structure 50 generally includes a high-k gate dielectric layer 51 conformally covering a bottom and a side wall of the gate opening, a work function layer 52 conformally covering the high-k gate dielectric layer 51, and a gate electrode layer 53 that covers the work function layer 52 and that is filled in the gate opening.

With increasing reduction of a critical dimension of an integrated circuit, a dimension of the opening 21 is also increasingly small, which can not only increase process difficulty of forming the opening 21, but also easily reduces a filling effect of the interlayer dielectric layer 40 within the opening 21, thereby affecting an electrical isolation effect of the interlayer dielectric layer 40 on the adjacent device unit regions 10s, further having a bad influence on performance of the transistor. In addition, in a fin field-effect transistor, a spacing between the opening 21 and an adjacent fin 12 is also increasingly small, and the metal gate structure 50 is generally a film stack structure, which correspondingly increases difficulty of forming the metal gate structure 20 within a region (a region shown in dotted circles in FIG. 5) between the opening 21 and the adjacent fin 12, thereby affecting quality of the metal gate structure 50, further having a bad influence on performance of the semiconductor structure.

In some other solutions, after the interlayer dielectric layer exposed from the top of the dummy gate structure is formed, the initial dummy gate structure at the junction between the adjacent device unit regions may also be removed to form the opening. Then, an isolation material is filled in the opening to form an isolation structure. However, the forming method still has the foregoing problems, leading to poor quality of the formed isolation structure and metal gate structure, and finally affecting the performance of the semiconductor structure.

To address the technical problem, in implementations of the present disclosure, the portion of the initial device gate structure in thickness at the junction between the adjacent device unit regions is etched, and the top opening is formed within the initial device gate structure to form the spacer layer on the side wall of the top opening. Afterwards, the remainder of the initial device gate structure exposed from the spacer layer is etched, the bottom opening exposed from the base is formed within the remainder of the initial device gate structure, the bottom opening being in communication with the top opening, and the remainder of the initial device gate structure being used as a device gate structure. The spacer layer is configured to adjust the width of the bottom opening, so that the width of the bottom opening is less than the width of the top opening. Therefore, in some implementations of the present disclosure, the width of the top opening can be properly increased, so that a process window in which the top opening is formed is enlarged, thereby better implementing isolation between the adjacent device unit regions, improving an integrity of the device gate structure, and further improving the performance of the semiconductor structure.

In order to make the foregoing objectives, features, and advantages of the present disclosure clearer and easier to understand, specific embodiments of the present disclosure are described in detail below with reference to the accompanying drawings.

FIG. 6 to FIG. 15 are schematic structural diagrams showing corresponding steps in one form of a method for forming a semiconductor structure according to the present disclosure.

Figure 6:
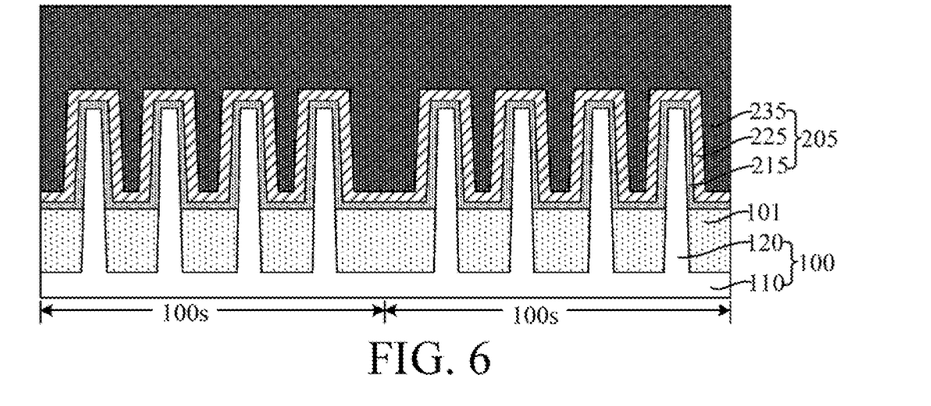
FIG. 6 to FIG. 15 are schematic structural diagrams showing corresponding steps in one form of a method for forming a semiconductor structure according to the present disclosure.

Referring to FIG. 6, a base 100 is provided, where the base 100 includes a plurality of adjacent device unit regions 100s, an initial device gate structure 205 is formed on the base 100, and the initial device gate structure 205 spans the plurality of device unit regions 100s.

In some implementations, because the formed semiconductor structure is a fin field-effect transistor, the base 100 includes a substrate 110 and a plurality of discrete fins 120 located on the substrate 110.

In some implementations, the substrate 110 is a silicon substrate. In other implementations, the substrate may also be made of other materials such as germanium, silicon germanium, silicon carbide, gallium arsenide, or indium gallium, and the substrate may also be other types of substrates such as a silicon substrate on an insulator or a germanium substrate on an insulator.

In some implementations, the fin 120 and the substrate 110 are formed into an integrated structure. In other implementations, the fin may also be a semiconductor layer epitaxially grown on the substrate, thereby precisely controlling a height of the fin.

Therefore, in some implementations, the fin 120 is made of a same material as that of the substrate 110, and the fin 120 is made of silicon. In other implementations, the fin may also be made of a semiconductor material suitable for forming the fin, such as germanium, silicon germanide, silicon carbide, gallium arsenide, or indium gallium. The material of the fin may also be different from the material of the substrate.

In some other implementations, the method may be further used to form a gate-all-around (GAA) transistor or a planar transistor.

The base 100 includes the plurality of adjacent device unit regions 100s, a junction between the adjacent device unit regions 100s being used as a cut region for defining a disconnecting position of the initial device gate structure 205, thereby obtaining a plurality of discrete device gate structures. In other words, along an extending direction of the initial device gate structure 205, transistors formed on a same device unit region 100s share a same device gate structure. In some implementations, along a direction perpendicular to a side wall of the fin 120, the base 100 includes a plurality of adjacent device units 100s.

An isolation layer 101 is further formed on the substrate 110 exposed from the fin 120, the isolation layer 101 covering a portion of the side wall of the fin 120, and a top of the isolation layer 101 being lower than a top of the fin 120.

The isolation layer 101 is used as a shallow trench isolation (STI) structure, where the isolation layer 101 is configured to isolate adjacent transistors. In some implementations, the isolation layer 101 is made of silicon oxide. In other implementations, the isolation layer may also be made of other insulating materials such as silicon nitride or silicon oxynitride.

The initial device gate structure 205 is configured to form a device gate structure upon etching to form an opening between adjacent device gate structures, thereby obtaining discrete device gate structures. In particular, the initial device gate structure 205 spans fins 120 of the plurality of device unit regions 100s, and covers a portion of the top and a portion of the side wall of the fin 120.

In some implementations, the initial device gate structure 205 is an initial metal gate structure and is configured to provide a basis for subsequently forming a metal gate structure. Therefore, the initial device gate structure 205 includes an initial gate dielectric layer 215, an initial work function layer 225 covering the initial gate dielectric layer 215, and an initial gate electrode layer 235 covering the initial work function layer 225.

The initial gate dielectric layer 215 is configured to provide a basis for subsequently forming a gate dielectric layer. In particular, the initial gate dielectric layer 215 is made of a high-k dielectric material. The high-k dielectric material refers to a dielectric material having a relative dielectric constant greater than a relative dielectric constant of silicon oxide. In some implementations, the initial gate dielectric layer 215 is made of $HfO_2$. In other implementations, the initial gate dielectric layer may also be made of a material selected from $ZrO_2$, HfSiO, HfSiON, HfTaO, HfSiO, HfZrO, or $Al_2O_3$.

The initial work function layer 225 is configured to provide a basis for subsequently forming a work function layer. The work function layer is configured to adjust a threshold voltage of the formed transistor.

When the formed transistor is a PMOS, the initial work function layer 225 is a P-type work function layer, that is, the initial work function layer 225 is made of a P-type work function material. A range of the work function material of the initial work function layer 225 is from 5.1 ev to 5.5 ev, for example, 5.2 ev, 5.3 ev, or 5.4 ev. The initial work function layer 225 is made of one or more of TiN, TaN, TaSiN, TaAlN, and TiAlN.

When the formed transistor is an NMOS, the initial work function layer 225 is an N-type work function layer, that is, the initial work function layer 225 is made of an N-type work function material. A range of the work function material of the initial work function layer 225 is from 3.9 ev to 4.5 ev, for example, 4 ev, 4.1 ev, or 4.3 ev. The initial work function layer 225 is made of one or more of TiAl, Mo, MoN, AlN, and TiAlC.

The initial gate electrode layer 235 is configured to provide a basis for subsequently forming a gate electrode layer. The gate electrode layer is used as an electrode to implement an electrical connection between the metal gate structure and an external circuit. In some implementations, the initial gate electrode layer 235 is made of W. In other implementations, the initial gate electrode layer may further be made of Al, Cu, Ag, Au, Pt, Ni, or Ti, etc.

In some implementations, the initial device gate structure 205 spans the plurality of device unit regions 100s, so that a process window in which the initial device gate structure 205 is formed is enlarged, thereby improving forming quality of the initial device gate structure 205. In particular, the initial device gate structure 205 is a film stack structure, and with increasing reduction of a critical dimension of an integrated circuit, an effect of improving forming quality of the initial device gate structure 205 becomes remarkable.

In particular, the initial device gate structure 205 is generally formed using a high k last metal gate last process. In other words, before the initial device gate structure 205 is formed, a dummy gate structure is formed at a position of the initial device gate structure 205, the dummy gate structure being configured to occupy a spatial position for forming the device gate structure 205. The initial device gate structure 205 is allowed to span the plurality of device unit regions 100s, before the dummy gate structure is removed, the dummy gate structure at the junction between the adjacent device unit regions 100s is not required to be etched, helping improve integrity of the device gate structure that is subsequently formed.

Figure 7:
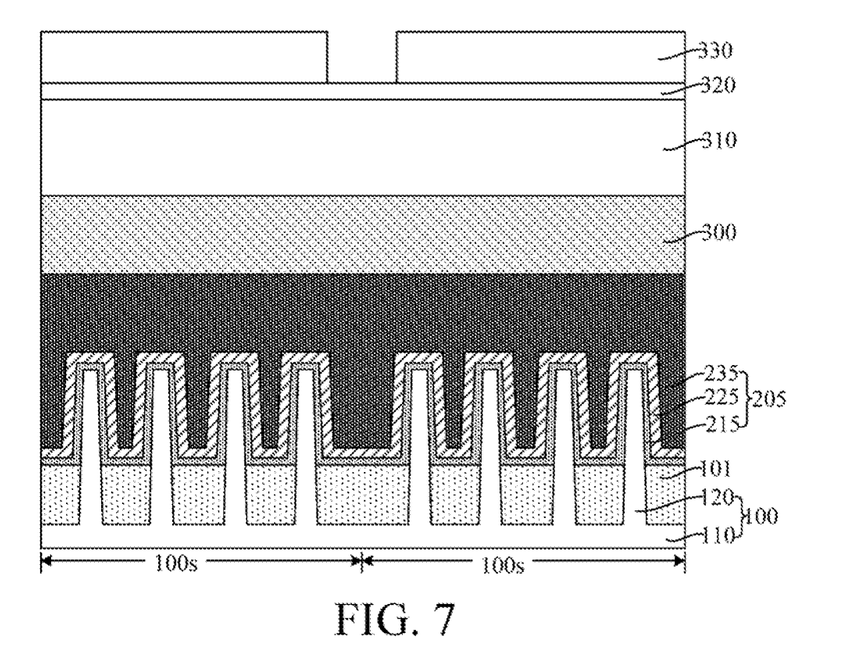
Figure 8:
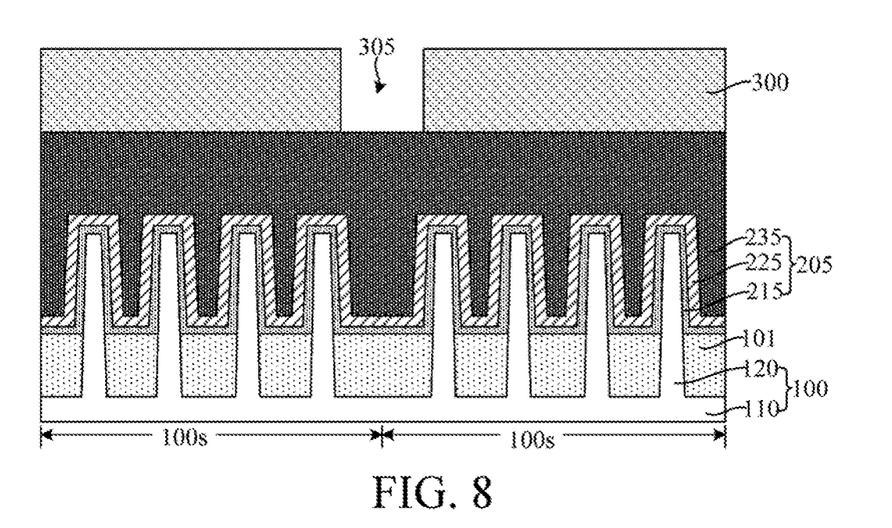
Figure 9:
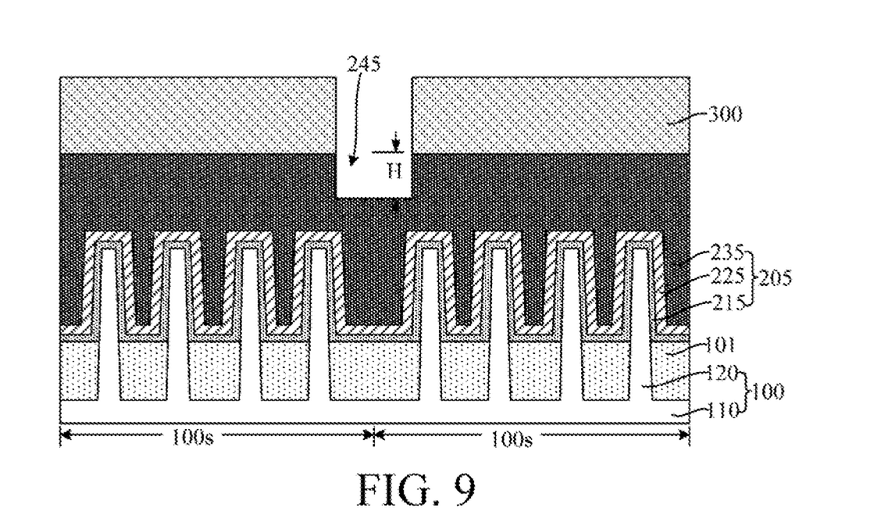

With reference to FIG. 7 to FIG. 9, a portion of the initial device gate structure 205 in thickness at the junction between the adjacent device unit regions 100s is etched to form a top opening 245 (shown in FIG. 9) within the initial device gate structure 205.

The top opening 245 is configured to define a disconnecting position of the initial device gate structure 205, thereby providing a basis for subsequently acquiring a plurality of discrete device gate structures.

In addition, the top opening 245 is configured to provide a process basis for subsequently forming a spacer layer. A subsequent manufacture procedure includes forming the spacer layer on a side wall of the top opening 245, and etching a remainder of the initial device gate structure 205 exposed from the spacer layer, to form a bottom opening exposed from a base 100 within the remainder of the initial device gate structure 205, an opening being formed for communication of the bottom opening and the top opening 245, and the opening being T-shaped. The spacer layer is configured to adjust a width of the bottom opening, so that the width of the bottom opening is less than a width of the top opening 245. Therefore, during a process of forming the top opening 245, the width of the top opening 245 can be properly increased, thereby enlarging a process window in which the top opening 245 is formed, which correspondingly enlarges a process window in which the opening is formed and reduces process difficulty of forming the opening.

In particular, with reference to FIG. 7 and FIG. 8, before the portion of the initial device gate structure 205 in thickness at the junction of the adjacent device unit regions 100s is etched, the method further includes: forming a mask layer 300 (as shown in FIG. 8) on the initial device gate structure 205, a masking opening 305 (as shown in FIG. 8) being formed within the mask layer 300.

The mask layer 300 is used as a mask for etching the initial device gate structure 205, the mask opening 305 being configured to define a shape, a position, and a dimension of the top opening 245 (as shown in FIG. 9).

The mask layer 300 is made of a hard mask (HM) material to meet a requirement for transfer precision of a pattern. Therefore, the mask layer 300 is made of one or more of silicon oxide, silicon nitride, silicon carbonitride, silicon oxycarbonitride, silicon oxynitride, boron nitride, and boron nitride.

In some implementations, the mask layer 300 is made of silicon nitride. Relatively high hardness and density of the silicon nitride help improve an effect of the mask layer 300 used as an etching mask, and the silicon nitride material has relatively high process compatibility. In other implementations, the mask layer is made of silicon oxide.

In particular, the step of forming the mask layer 300 and the mask opening 305 includes: as shown in FIG. 7, successively forming, on the initial device gate structure 205, a mask material layer 300, an organic coating 310 located on the mask material layer 300, an anti-reflection coating 320 located on the organic coating 310, and a photoresist layer 330 located on the anti-reflection coating 320. A pattern opening (not marked) exposed from a portion of the anti-reflection coating 320 is formed within the photoresist layer 330. The photoresist layer 330 is used as a mask. The anti-reflection coating 320, the organic coating 310, and the mask material layer 300 are successively etched along the pattern opening. A mask opening 305 is formed within the mask material layer 300, and a remainder of the mask material layer 300 is used as the mask layer 300.

The organic coating 310 is configured to provide a good interface state for forming a subsequent mask layer, so as to improve surface flatness of the subsequent mask layer, further improving profile quality and dimension precision of the pattern opening. In some implementations, the organic coating 310 is a spin on carbon (SOC) layer.

The anti-reflection coating 320 is configured to reduce a reflection effect during exposure, thereby improving transfer precision of the pattern. In some implementations, the anti-reflection coating 320 is a Si-ARC layer (a Si-based anti-reflection coating), the Si-ARC layer helping improve exposure uniformity, thereby helping further improve the transfer precision of the pattern.

During a process of etching, the photoresist layer 330 and the anti-reflection coating 320 are successively consumed. Therefore, after the mask layer 300 is formed, a portion of the organic coating 310 in thickness is only retained on a top of the mask layer 300. Correspondingly, the forming method further includes: removing a remainder of the organic coating 310. The remainder of the organic coating 310 is removed to expose the mask layer 300, thereby providing a process basis for subsequently forming the spacer layer. In particular, the remainder of the organic coating 310 is removed in an ashing manner.

It should be noted that in other implementations, other single-layer or laminated-layer mask structures may further be used to perform a graphical process, so that a mask layer having the mask opening is formed.

Referring to FIG. 9, the step of etching a portion of an initial device gate structure 205 in thickness at a junction of adjacent device unit regions 100s includes: using the mask layer 300 as a mask, and etching the portion of the initial device gate structure 205 in thickness exposed from the mask opening 305 (as shown in FIG. 8), to form a top opening 245.

In some implementations, the portion of the initial device gate structure 205 in thickness at the junction between the adjacent device unit regions 100s is etched using a dry etching process. The dry etching process has an anisotropic etching characteristic and relatively good capability of controlling profile etching. The dry etching process is used, helping improve flatness of a side wall of the top opening 245, and facilitates controlling of a width (not marked) and a depth H of the top opening 245. The width of the top opening 245 refers to a dimension of the top opening 245 along a direction that is parallel to a surface of the base 100 and that is perpendicular to an extending direction of the top opening 245.

According to design requirements of an integrated circuit, there is a preset spacing between adjacent device gate structures located on a side wall of the fin 120, and the width of the top opening 245 is greater than the preset spacing, thereby providing a spatial position for subsequently forming a spacer layer. In particular, a difference value between the width of the top opening 245 and the preset spacing is equal to 2 times of a thickness of the spacer layer.

The preset spacing is a width of a bottom opening.

It should be noted that a ratio of the depth H of the top opening 245 to a thickness (not marked) of the initial gate electrode layer 235 located on the top of the fin 120 should be neither excessively small, nor excessively large. If the ratio is excessively small, that is, the depth H of the top opening 245 is excessively small, a process window in which the T-shaped opening is formed is not remarkably enlarged. If the ratio is excessively large, that is, the depth H of the top opening 245 is excessively large, an initial work function layer 225 or an initial gate dielectric layer 215 is easily damaged, thereby affecting performance of the device gate structure. Accordingly, in some implementations, the depth H of the top opening 245 accounts for 10% to 80% of the thickness of the initial gate electrode layer 235 located on the top of the fin 120.

In some implementations, after the top opening 245 is formed, the mask layer 300 is retained.

Figure 10:
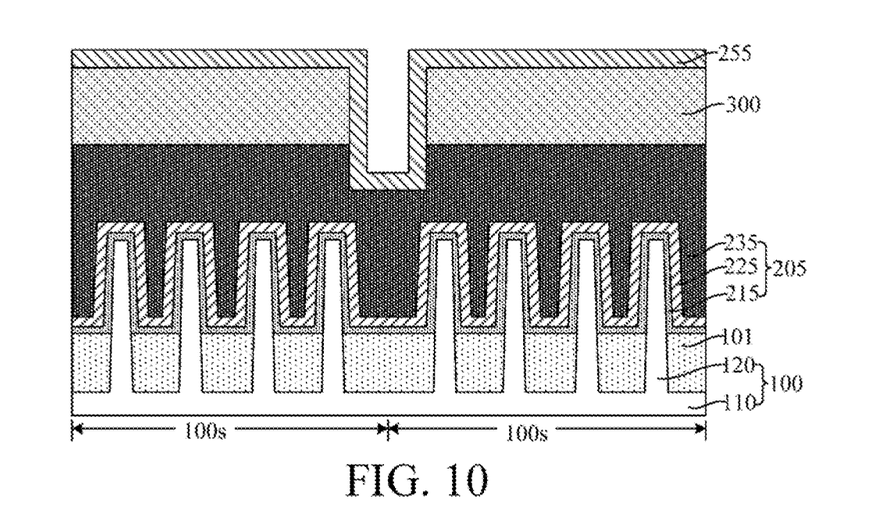
Figure 11:
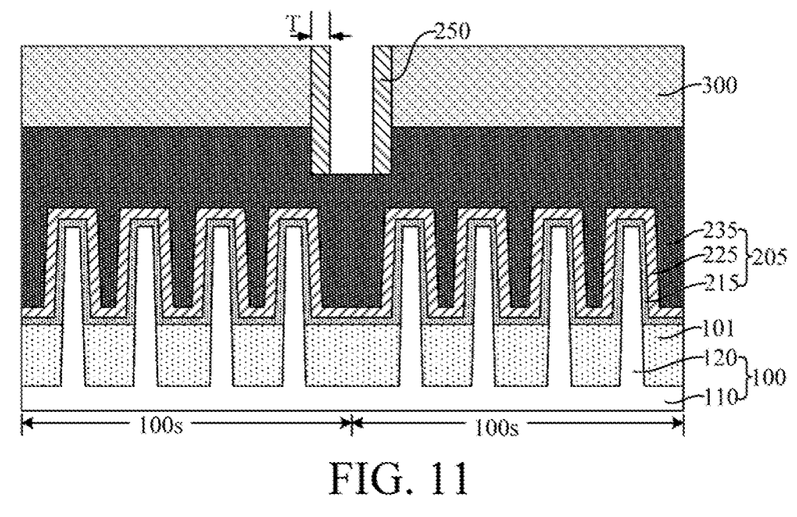

With reference to FIG. 10 to FIG. 11, a spacer layer 250 is formed on a side wall of the top opening 245 (as shown in FIG. 9).

When the remainder of the initial device gate structure 205 exposed from the top opening 245 is subsequently etched to form a bottom opening, the spacer layer 250 is configured to etch a mask. Correspondingly, the spacer layer 250 can adjust a width of the bottom opening, so that a width of the bottom opening is less than the width (not marked) of the top opening 245. Therefore, during a process of forming the top opening 245, the width of the top opening 245 can be properly increased, which helps enlarge a process window in which the top opening 245 is formed, and also helps enlarge a process window in which the bottom opening is formed, correspondingly helping improve forming quality of the top opening 245 and the bottom opening, thereby better implementing isolation between the adjacent device unit regions 100s.

In some implementations, after the top opening 245 is formed, the mask layer 300 is retained. Therefore, in order to reduce process difficulty, the spacer layer 250 is further formed on a side wall of the mask opening 305 (as shown in FIG. 8). In addition, the spacer layer 250 is further formed on a side wall of the mask opening 305, correspondingly increasing a height of the spacer layer 250. When the remainder of the initial device gate structure 205 exposed from the top opening 245 is subsequently etched, a probability that the spacer layer 250 is consumed excessively fast is reduced, thereby ensuring a mask etching effect of the spacer layer 250.

In particular, the step of forming the spacer layer 250 includes: as shown in FIG. 10, a spacer film 255 is formed to conformally cover a side wall of the mask opening 305, a bottom and a side wall of the top opening 245, and a top of the mask layer 300. As shown in FIG. 11, spacer films 255 on the top of the mask layer 300 and on a bottom of the top opening 245 are removed, and the spacer films 255 on the side wall of the mask opening 305 and on the side wall of the top opening 245 are retained and used as spacer layers 250.

In some implementations, the spacer film 255 is formed using an atomic layer deposition process. The atomic layer deposition process is forming a thin film through layer-by-layer deposition in the form of a single-atom layer. The process has strong interstitial capability and step coverage capability, helping improve forming quality and thickness uniformity of the spacer film 255, and reducing difficulty of controlling a thickness of the spacer film 255. With increasing reduction of a critical dimension of the integrated circuit, the atomic layer deposition process is referred to as a common deposition process to improve a conformal coverage effect of the spacer film 255. In other implementations, the spacer film may also be formed using a chemical vapor deposition process according to actual process conditions.

In some implementations, the spacer film 255 is etched using a maskless dry etching process, to remove the spacer films 255 on the top of the mask layer 300 and on the bottom of the top opening 245. The maskless dry etching process is selected to etch the spacer film 255 along a direction perpendicular to the surface of the base 100, so that the spacer films 255 on the side wall of the mask opening 305 and on the side wall of the top opening 245 can be retained when the spacer films 255 on the top of the mask layer 300 and on the bottom of the top opening 245 are removed.

In some implementations, the spacer layer 250 is made of a dielectric material, so that process compatibility of the spacer layer 250 is improved, and an influence on transistor performance is reduced. In addition, the spacer layer 250 that is made of the dielectric material has insulatively. When the spacer layer 250 is subsequently retained, the spacer layer 250 can also electrically isolate adjacent device gate structures. The dielectric material includes one or more of silicon oxide, silicon oxynitride, silicon nitride, silicon carbonitride, silicon oxycarbonitride, silicon oxynitride, boron nitride, and carbon boron nitride.

In some implementations, the spacer layer 250 is made of silicon nitride. Relatively high density of the silicon nitride helps improve the electrical isolation effect of the spacer layer 250 on the adjacent device gate structures, and the silicon nitride is a frequently-used hard mask material in the semiconductor field. In other implementations, the spacer layer is made of silicon oxide.

It should be noted that a thickness T (as shown in FIG. 11) of the spacer layer 250 should be neither excessively small, nor excessively large.

If the thickness T is excessively small, when the width of the top opening 245 is fixed, the width of the bottom opening is likely to be excessively large, thereby causing the initial device gate structure 205 to be excessively etched, having a bad influence on the performance of the device gate structure, and further leading to reduction of the transistor performance. For example, the bottom opening is easily exposed from a fin 120 close to a junction between the adjacent device unit regions 100s. If the thickness T is extremely large, when the width of the top opening 245 is fixed, the mask opening 305 is easily merged with the spacer layer 250 on the side wall of the top opening 245, or difficulty of subsequently etching the remainder of the initial device gate structure 205 is easily increased, thereby affecting forming quality of the bottom opening, or the width of the bottom opening is excessively small, correspondingly affecting forming quality of a subsequent isolation structure in the bottom opening. Accordingly, in some implementations, the thickness T of the spacer layer 250 is 0.5 nm to 20 nm along a direction perpendicular to the side wall of the top opening 245.

Figure 12:
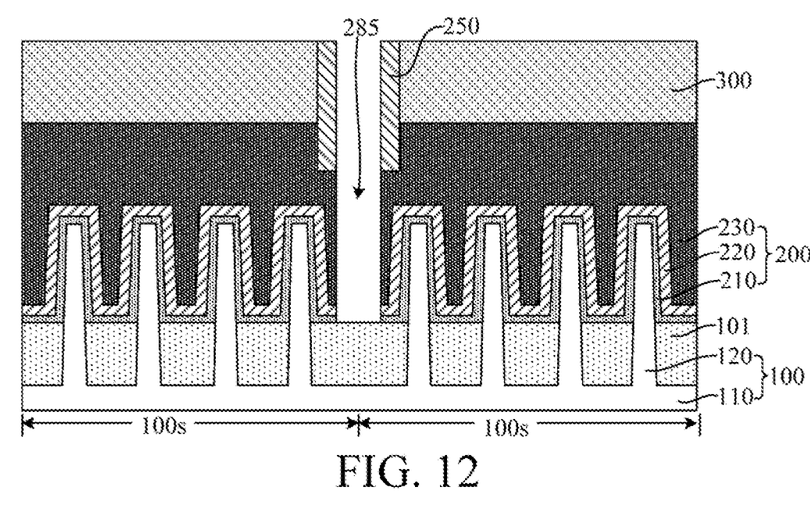

Referring to FIG. 12, the remainder of the initial device gate structure 205 (as shown in FIG. 11) exposed from the spacer layer 250 is etched to form a bottom opening 285 exposed from the base 100 within the remainder of the initial device gate structure 205, a top of the bottom opening 285 being in communication with a bottom of a top opening 245 (as shown in FIG. 9), and the remainder of the initial device gate structure 205 being used as a device gate structure 200.

The initial device gate structure 205 is cut off through the top opening 245 and the bottom opening 285, thereby obtaining a plurality of discrete device gate structures 200, so that transistors in a same device unit region 100s share a same device gate structure 200.

In comparison to a solution that an initial dummy gate structure at the junction between the adjacent device unit regions is cut off to form dummy gate structures and an opening between adjacent dummy gate structures, then an interlayer dielectric layer is formed in the opening, and after the interlayer dielectric layer is formed, the dummy gate structure is replaced with the device gate structure, in the embodiment, the initial device gate structure 205 is first formed, then the initial device gate structure 205 is cut off to form the device gate structure 200, so that difficulty of forming the device gate structure in a region between the opening and the adjacent fins is reduced, which improves integrity of the device gate structure 200, thereby improving performance of the transistor and performance uniformity. In addition, the foregoing method has relatively high process compatibility and seldom has a negative impact on the performance of the transistor.

In some implementations, during a process of etching the initial device gate structure 205, the mask layer 300 and the spacer layer 250 are used as masks. Therefore, a width (not marked) of the bottom opening 285 is less than a width (not marked) of the top opening 245. The width of the bottom opening 285 refers to a dimension of the bottom opening 285 along a direction that is parallel to a surface of the base 100 and that is perpendicular to an extending direction of the bottom opening 285.

In particular, the mask layer 300 and the spacer layer 250 are used as masks to successively etch a remaining initial gate electrode layer 235 (as shown in FIG. 11), an initial work function layer 225 (as shown in FIG. 11), and an initial gate dielectric layer 215 (as shown in FIG. 11) that are exposed from the spacer layer 250.

After the bottom opening 285 is formed, the remaining initial gate electrode layer 235 is used as a gate electrode layer 230, the remaining initial work function layer 225 is used as a work function layer 220, and the remaining initial gate dielectric layer 215 is used as a gate dielectric layer 210. The gate dielectric layer 210, the work function layer 220, and the gate electrode layer 230 are configured to constitute the device gate structure 200, and the device gate structure 200 is correspondingly a metal gate structure. For specific description of the gate dielectric layer 210, the work function layer 220, and the gate electrode layer 230, reference may be made to the foregoing corresponding description of the initial device gate structure 205, and details are not described herein again.

In some implementations, the base 100 includes a substrate 110 and a fin 120 protruding from the substrate 110. Therefore, the remainder of the initial device gate structure 205 between the adjacent fins 120 is etched at a junction between the adjacent initial device unit regions 100s, to ensure integrity of the device gate structure 200 and capability of controlling a channel by the device gate structure 200.

In some implementations, the remaining initial device gate structure 205 exposed from the spacer layer 250 is etched using the dry etching process. The dry etching process has an anisotropic etching characteristic and relatively good capability of controlling profile etching, which can help improve flatness of a side wall of the top opening 285, easily controlling a width (not marked) of the bottom opening 285, thereby improving quality of the device gate structure 200.

In some implementations, after the bottom opening 285 is formed, the mask layer 300 and the spacer layer 250 are retained. The spacer layer 250 is made of a dielectric material. The spacer layer 250 is retained, so that the step of removing the spacer layer 250 is omitted, thereby simplifying process steps.

Figure 13:
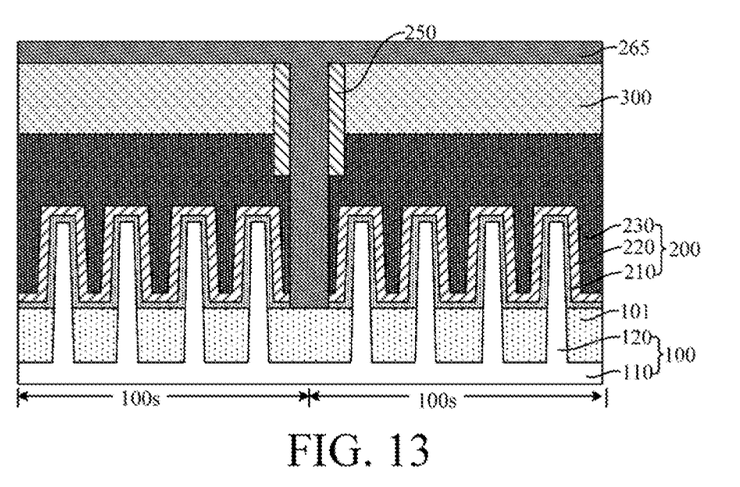
Figure 14:
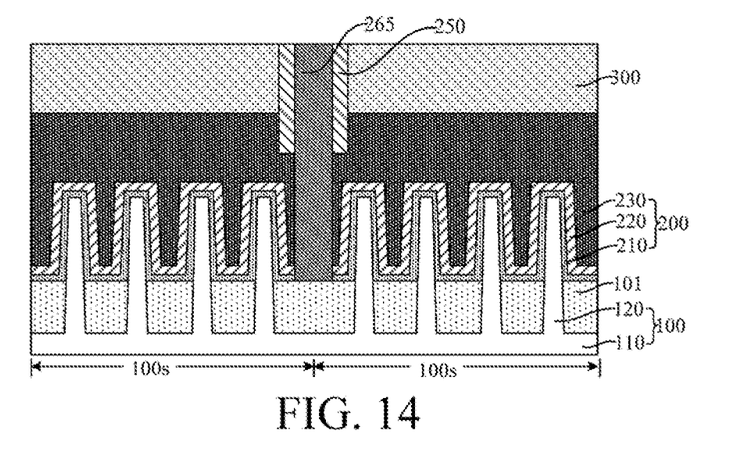
Figure 15:
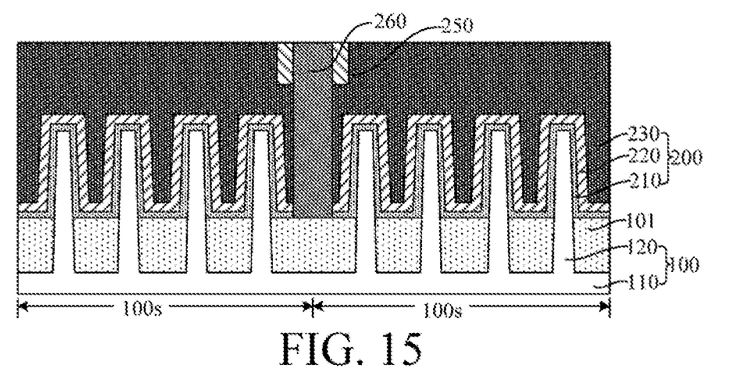

With reference to FIG. 13 to FIG. 15, an isolation structure 260 (as shown in FIG. 15) is formed within the top opening 245 (as shown in FIG. 9) and the bottom opening 285 (as shown in FIG. 12).

The isolation structure 260 is configured to implement electrical isolation between the adjacent device gate structures 200.

Therefore, the isolation structure 260 is made of an insulating material. In some implementations, the isolation structure 260 is made of silicon nitride. Due to relatively high density of the silicon nitride, the silicon nitride is selected, which helps improve a protection function of the isolation structure 260 on the device gate structure 200. In other implementations, the isolation structure may also be made of other dielectric materials such as silicon oxide or silicon oxynitride.

In particular, the step of forming the isolation structure 260 includes: as shown in FIG. 13, filling an isolation material layer 265 within the mask opening 305 (as shown in FIG. 8), the top opening 245 (as shown in FIG. 9), and the bottom opening 285 (as shown in FIG. 12), the isolation material layer 265 further covering a top of the mask layer 300.

The step of forming the isolation material layer 265 is used as a basis for subsequently forming an isolation structure.

In particular, the isolation material layer 265 is formed using an atomic layer deposition process. During a process of forming the isolation material layer 265, the isolation material layer 265 is deposited in a form of an atomic layer. The atomic layer deposition process has good step coverage capability and gap filling capability, and a film layer material with a relatively uniform thickness can be formed, helping improve quality and thickness uniformity of the isolation material layer 265.

In addition, during a process of forming the isolation material layer 265, with a continuous increase in a thickness of the deposited material, the film layer materials located on side walls of the mask opening 305, the top opening 245, and the bottom opening 285 are merged, so that the formed isolation material layer 265 is filled in the masking opening 305, the top opening 245, and the bottom opening 285, and a probability that a void is formed in the isolation material layer 265 filled within the mask opening 305, the top opening 245, and the bottom opening 285 is reduced, thereby helping improve an isolation effect of a subsequent isolation structure.

As shown in FIG. 14, the isolation material layer 265 is etched back to remove the isolation material layer 265 that is higher than a top of the mask layer 300.

Etch-back processing is first performed to expose the mask layer 300, so that a chemical mechanical polishing process is performed subsequently. In addition, the etch-back processing can more easily control a removed amount of the isolation material layers 265 with relatively high process controllability and stability. In some implementations, the etch-back processing is performed using the dry etching process, thereby improving surface dishing of the remaining isolation material layer 265.

The mask layer 300 is formed on the top of the device gate structure 200. During a process of the etch-back processing, the top of the mask layer 300 is configured to define a position at which etching stops, so that the device gate structure 200 can be protected to prevent the device gate structure 200 from being damaged during the etch-back processing, thereby ensuring quality and performance of the device gate structure 200, correspondingly helping improve the performance of the transistor.

As shown in FIG. 15, upon the etch-back processing, the mask layer 300 (as shown in FIG. 14), the spacer layer 250, and the remainder of the isolation material layer 265 (as shown in FIG. 14) are flattened using the chemical mechanical polishing process, and the remainder of the isolation material layer 265 within the top opening 245 (as shown in FIG. 9) and the bottom opening 285 (as shown in FIG. 12) is retained and used as the isolation structure 260.

In some implementations, the mask layer 300, the spacer layer 250, and the isolation material layer 265 are made of a same material. Therefore, flattened processing is easily performed using the same chemical mechanical polishing process, and the process is simple.

The gate electrode layer 230 is made of a metal material. Therefore, in the step of the chemical mechanical polishing process, a top of the gate electrode layer 230 is easily used as a polishing stop position, and the mask layer 300, the spacer layer 250, and the remainder of the isolation material layer 265 that are higher than the gate electrode layer 230 are removed. Correspondingly, after the isolation structure 260 is formed, the top of the isolation structure 260 is flush with the top of the gate electrode layer 230, and a portion of the remaining spacer layer 250 in height is retained between a side wall of the isolation structure 260 and a side wall of the top opening 245.

Correspondingly, the present disclosure further provides a semiconductor structure. Still referring to FIG. 15, a schematic structural diagram of an embodiment of a semiconductor structure according to the present disclosure is shown.

The semiconductor structure includes: a base 100, the base 100 including a plurality of adjacent device unit regions 100s; a device gate structure 200 located on the base 100, the adjacent device gate structures 200 and the base 100 enclosing a T-shaped opening (not marked) at a junction between the adjacent device unit regions 100s, the opening including a bottom opening 285 (as shown in FIG. 12) and a top opening 245 (as shown in FIG. 9), a top of the bottom opening 285 being in communication with a bottom of the top opening 245, and along a direction perpendicular to a side wall of the opening, a width (not marked) of the top opening 245 being greater than a width (not marked) of the bottom opening 285; a spacer layer 250 located on a side wall of the top opening 245, a side wall of the spacer layer 250 being flush with a side wall of the bottom opening 285; and an isolation structure 260 located in the top opening 245 exposed from the spacer layer 250 and the bottom opening 285.

At the junction between the adjacent device unit regions 100s, the adjacent device gate structures 200 and the base 100 enclose a T-shaped opening, the opening being formed through an etching process, so that the adjacent device gate structures 200 are cut off at the junction between the adjacent device unit regions 100s. The spacer layer 250 is formed on the side wall of the top opening 245, and the side wall of the spacer layer 250 is flush with the side wall of the bottom opening 285. The spacer layer 250 is suitable for serving as an etching mask for forming the bottom opening 285, and the spacer layer 250 can adjust the width of the bottom opening 285, so that the width of the bottom opening 285 is less than the width of the top opening 245. Therefore, when the top opening 245 is formed, the width of the top opening 245 can be properly increased, helping enlarge a process window in which the top opening 245 is formed, correspondingly enlarging a process window in which the opening is formed and reducing process difficulty of forming the opening, thereby improving forming quality of the opening, further better implementing isolation between the adjacent device unit regions 100s.

In comparison to a solution that an initial dummy gate structure at the junction between the adjacent device unit regions is cut off to form dummy gate structures and an opening between adjacent dummy gate structures, then an interlayer dielectric layer is formed in the opening, and after the interlayer dielectric layer is formed, the dummy gate structure is replaced with the device gate structure, in some implementations, difficulty of forming the device gate structure in a region between the opening and an adjacent fin can be avoided. This correspondingly improves integrity of the device gate structure 200, thereby improving performance of the transistor.

In some implementations, the base 100 includes a substrate 110 and a plurality of discrete fins 120 located on the substrate 110.

In some implementations, the substrate 110 is a silicon substrate. In other implementations, the substrate may also be made of other materials such as germanium, silicon germanium, silicon carbide, gallium arsenide, or indium gallium, and the substrate may also be other types of substrates such as a silicon substrate on an insulator or a germanium substrate on an insulator.

In some implementations, the fin 120 and the substrate 110 are formed into an integrated structure. Therefore, the fin 120 is made of a same material as that of the substrate 110, and the fin 120 is made of silicon. In other implementations, the fin may also be a semiconductor layer epitaxially grown on the substrate, and the fin may also be made of a material different from that of the substrate.

In some other implementations, the semiconductor structure may also be a GAA transistor or a planar transistor.

The base 100 includes a plurality of adjacent device unit regions 100s, and along an extending direction of the device gate structure 200, transistors located on a same device unit regions 100s share a same device gate structure 200. In particular, along a direction perpendicular to a side wall of the fin 120, the base 100 includes a plurality of adjacent device units 100s.

An isolation layer 101 is further formed on the substrate 110 exposed from the fin 120, the isolation layer 101 covering a portion of the side wall of the fin 120, and a top of the isolation layer 101 being lower than a top of the fin 120. The isolation layer 101 serves as a shallow trench isolation structure, and is configured to isolate adjacent transistors.

In some implementations, the isolation layer 101 is made of silicon oxide. In other implementations, the isolation layer may also be made of other insulating materials such as silicon nitride or silicon oxynitride.

The device gate structure 200 is configured to control opening and closing of a transistor channel. The adjacent device gate structures 200 are isolated with each other at the junction between the adjacent device unit regions 100s. In particular, in each device unit region 100s, the device gate structure 200 spans a plurality of fins 120 and covers a portion of a top and a portion of a side wall of the fin 120.

In some implementations, the device gate structure 200 is a metal gate structure. Therefore, the device gate structure 200 includes a gate dielectric layer 210, a work function layer 220 covering the gate dielectric layer 210, and a gate electrode layer 230 covering the work function layer 220.

For detailed descriptions of the gate dielectric layer 210, the work function layer 220, and the gate electrode layer 230, reference may be made to corresponding descriptions in the foregoing embodiment, and details are not described herein again.

The adjacent device gate structures 200 are isolated at the junction between the adjacent device unit regions 100s through the top opening 245 and the bottom opening 285.

In some implementations, a difference value between a width of the top opening 245 and a width of the bottom opening 285 is equal to 2 times of a thickness of the spacer layer 250. According to design requirements of an integrated circuit, there is a preset spacing between the adjacent device gate structures 200 located on a side wall of the fin 120, the preset spacing being equal to the width of the bottom opening 285.

A ratio of a depth of the top opening 245 to a thickness (not marked) of the gate electrode layer 230 located on the top of the fin 120 should be neither excessively small, nor excessively large. If the ratio is excessively small, that is, the depth of the top opening 245 is excessively small, the process window in which the T-shaped opening is formed is not remarkably enlarged. If the ratio is excessively large, that is, the depth of the top opening 245 is excessively large, when the top opening 245 is formed through an etching process, the work function layer 220 or the gate dielectric layer 210 is likely to be damaged, thereby affecting performance of the device gate structure 200. Accordingly, in some implementations, the depth of the top opening 245 accounts for 10% to 80% of the thickness of the gate electrode layer 230 located on the top of the fin 120.

In some implementations, the spacer layer 250 is made of a dielectric material, so that process compatibility of the spacer layer 250 is improved, and an influence on transistor performance is reduced. In addition, the spacer layer 250 that is made of the dielectric material has insulatively, and the spacer layer 250 can also electrically isolate the adjacent device gate structures 200. What's more, during the process of forming the semiconductor structure, the step of removing the spacer layer 250 is omitted, helping simplify the process steps.

In some implementations, the spacer layer 250 is made of silicon nitride. Relatively high density of the silicon nitride helps improve an electrical isolation function of the spacer layer 250 on the adjacent device gate structures 200, and the silicon nitride is a frequently-used hard mask material. In other implementations, the spacer layer may also be made of silicon oxide.

It should be noted that the thickness of the spacer layer 250 should be neither excessively small, nor excessively large. If the thickness is excessively small, when the width of the top opening 245 is fixed, the width of the bottom opening 285 is likely to be excessively large, easily causing a bad influence on performance of the device gate structure 200. For example, the bottom opening 285 is likely to expose the fin 120 close to the junction between the adjacent device unit regions 100s, thereby leading to reduction of the transistor performance. If the thickness is excessively large, when the width of the top opening 245 is fixed, the spacer layers 250 located on the side wall of the top opening 245 are likely to merge with each other, or forming quality of the bottom opening 285 is affected, and the width of the bottom opening 285 is excessively small, correspondingly affecting forming quality of the isolation structure 260. Accordingly, in some implementations, a range of the thickness of the spacer layer 250 is from 0.5 nm to 20 nm along a direction perpendicular to the side wall of the top opening 245.

The isolation structure 260 is configured to implement electrical isolation between the adjacent device gate structures 200.

Therefore, the isolation structure 260 is made of an insulating material. In some implementations, the isolation structure 260 is made of silicon nitride to improve a protection function of the isolation structure 260 on the device gate structure 200. In other implementations, the isolation structure may also be made of other dielectric materials such as silicon oxide or silicon oxynitride.

The semiconductor structure may be formed using the forming method in the foregoing embodiment, or may be formed using other forming methods. For detailed descriptions of the semiconductor structure in some implementations, reference may be made to the corresponding descriptions in the foregoing embodiments, and details are not described herein again in some implementations.

Although the present disclosure is disclosed above, the present disclosure is not limited thereto. Various changes and modifications may be made by those skilled in the art without departing from the spirit and the scope of the present disclosure, and therefore the scope of the present disclosure should be subject to the scope defined by the claims.

What is claimed is:

1. A method for forming a semiconductor structure, comprising:
   providing a base, where the base comprises a plurality of device unit regions that are adjacent to each other, an initial device gate structure is formed on the base, and the initial device gate structure spans a plurality of device unit regions;
   forming a mask layer on the initial device gate structure, where a mask opening is formed within the mask layer;
   after forming the mask layer on the initial device gate structure, etching a portion of the initial device gate structure in thickness at a junction between adjacent device unit regions of the plurality of device unit regions to form a top opening within the initial device gate structure, wherein etching the portion of the initial device gate structure comprises:
      using the mask layer as a mask to etch the portion of the initial device gate structure in thickness exposed from the mask opening;
   forming a spacer layer on a side wall of the top opening and on a side wall of the mask opening;
   etching a remainder of the initial device gate structure exposed from the spacer layer to form a bottom opening exposed from the base within the remainder of the initial device gate structure, where the bottom opening is in communication with the top opening, and the remainder of the initial device gate structure is used as a device gate structure; and
   forming an isolation structure within the top opening and the bottom opening.

2. The method for forming a semiconductor structure according to claim 1, wherein:
   the step of forming the spacer layer comprises: forming a spacer film, where the spacer film conformally covers the side wall of the mask opening, a bottom and the side wall of the top opening, and a top of the mask layer; and
   removing spacer films on the top of the mask layer and the bottom of the top opening, and retaining spacer films on the side wall of the mask opening and on the side wall of the top opening as the spacer layer.

3. The method for forming a semiconductor structure according to claim 2, wherein the spacer film is formed using an atomic layer deposition process.

4. The method for forming a semiconductor structure according to claim 1, wherein:
   the step of forming an isolation structure within the top opening and the bottom opening comprises:
      filling an isolation material layer within the mask opening, the top opening, and the bottom opening, where the isolation material layer further covers a top of the mask layer;
      etching back the isolation material layer, and removing the isolation material layer higher than the top of the mask layer; and
      after the etch-back processing, flattening the mask layer, the spacer layer, and a remainder of the isolation material layer using a chemical mechanical polishing process, and retaining the remainder of the isolation material layer within the top opening and the bottom opening as the isolation structure.

5. The method for forming a semiconductor structure according to claim 4, wherein the isolation material layer is formed using an atomic layer deposition process.

6. The method for forming a semiconductor structure according to claim 1, wherein the portion of the initial device gate structure in thickness at the junction between the adjacent device unit regions is etched using a dry etching process.

7. The method for forming a semiconductor structure according to claim 1, wherein the remainder of the initial device gate structure exposed from the spacer layer is etched using a dry etching process.

8. The method for forming a semiconductor structure according to claim 1, wherein a range of a thickness of the spacer layer is from 0.5 nm to 20 nm along a direction perpendicular to the side wall of the top opening.

9. The method for forming a semiconductor structure according to claim 1, wherein the spacer layer is made of a dielectric material.

10. The method for forming a semiconductor structure according to claim 1, wherein:
    in the step of providing the base, the initial device gate structure is an initial metal gate structure; and
    in the step of etching a remainder of the initial device gate structure exposed from the spacer layer, the device gate structure is a metal gate structure.

11. A method for forming a semiconductor structure, comprising:
    providing a base, where the base comprises a plurality of device unit regions that are adjacent to each other, an initial device gate structure is formed on the base, and the initial device gate structure spans a plurality of device unit regions and comprises an initial gate electrode layer;
    etching a portion of the initial device gate structure in thickness at a junction between adjacent device unit regions of the plurality of device unit regions to form a top opening within the initial device gate structure, wherein a depth of the top opening accounts for 10% to 80% of a thickness of the initial gate electrode layer on the top of the fin;
    forming a spacer layer on a side wall of the top opening;

etching a remainder of the initial device gate structure exposed from the spacer layer to form a bottom opening exposed from the base within the remainder of the initial device gate structure, where the bottom opening is in communication with the top opening, and the remainder of the initial device gate structure is used as a device gate structure; and forming an isolation structure within the top opening and the bottom opening;

wherein in the step of providing the base, the base further comprises a substrate and a fin protruding from the substrate, along a direction perpendicular to a side wall of the fin, where the base comprises a plurality of adjacent device units;

wherein the initial device gate structure spans fins of the plurality of device unit regions, and covers a portion of a top and a portion of a side wall of the fin; and wherein in the step of etching a remainder of the initial device gate structure exposed from the spacer layer, the remainder of the initial device gate structure between the adjacent fins is etched at the junction between the adjacent initial device unit regions.

* * * * *